(12) United States Patent
Klein et al.

(10) Patent No.: US 7,205,825 B2
(45) Date of Patent: Apr. 17, 2007

(54) EMULATION OF LONG DELAY CHAIN BY RING OSCILLATOR WITH FLOATING BODY-TIED BODY DEVICES

(75) Inventors: Richard K. Klein, Mountain View, CA (US); Mario M. Pelella, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/315,393

(22) Filed: Dec. 9, 2002

(65) Prior Publication Data

US 2004/0108886 A1    Jun. 10, 2004

(51) Int. Cl.
*G05F 1/10* (2006.01)
(52) U.S. Cl. .......................................... 327/537; 331/57
(58) Field of Classification Search ................ 327/530, 327/534–537, 538–546; 257/350, 372, 314
See application file for complete search history.

(56) References Cited

U.S. PATENT DOCUMENTS

| | | | | |
|---|---|---|---|---|
| 5,557,231 A | * | 9/1996 | Yamaguchi et al. | ........ 327/534 |
| 5,610,533 A | * | 3/1997 | Arimoto et al. | ............... 326/33 |
| 5,838,047 A | * | 11/1998 | Yamauchi et al. | .......... 257/372 |
| 6,291,857 B1 | * | 9/2001 | Hirano | ........................ 257/350 |

* cited by examiner

*Primary Examiner*—Minh Nguyen
(74) *Attorney, Agent, or Firm*—Winstead PC (57) ABSTRACT

A method and apparatus for reducing the number of stages for measuring first and second switching speeds for PD/SOI transistors uses an inverter circuit which includes: a p-channel body-tied transistor; an n-channel body-tied transistor, coupled at their drains and gates; and a first and a second group of components tied to the bodies of the transistors. The first group restores body potentials for the transistors if the inverter circuit belongs to an even numbered stage of a ring oscillator. The second group provides body potentials for the transistors if the inverter circuit belongs to an odd numbered stage. After each transition of a waveform, the body potentials for the PD/SOI transistors are restored to the original potentials as stored in the capacitors. In this manner, a much smaller ring oscillator with fewer number of stages may be used to accurately measure the first and second switching speeds.

7 Claims, 8 Drawing Sheets

EMULATION OF LONG DELAY CHAIN BY RING OSCILLATOR WITH FLOATING BODY-TIED BODY DEVICES

FIELD OF THE INVENTION

The present invention relates to delays in floating body SOI devices, and more particularly to the use of ring oscillators in measuring these delays.

BACKGROUND OF THE INVENTION

Figure 1:
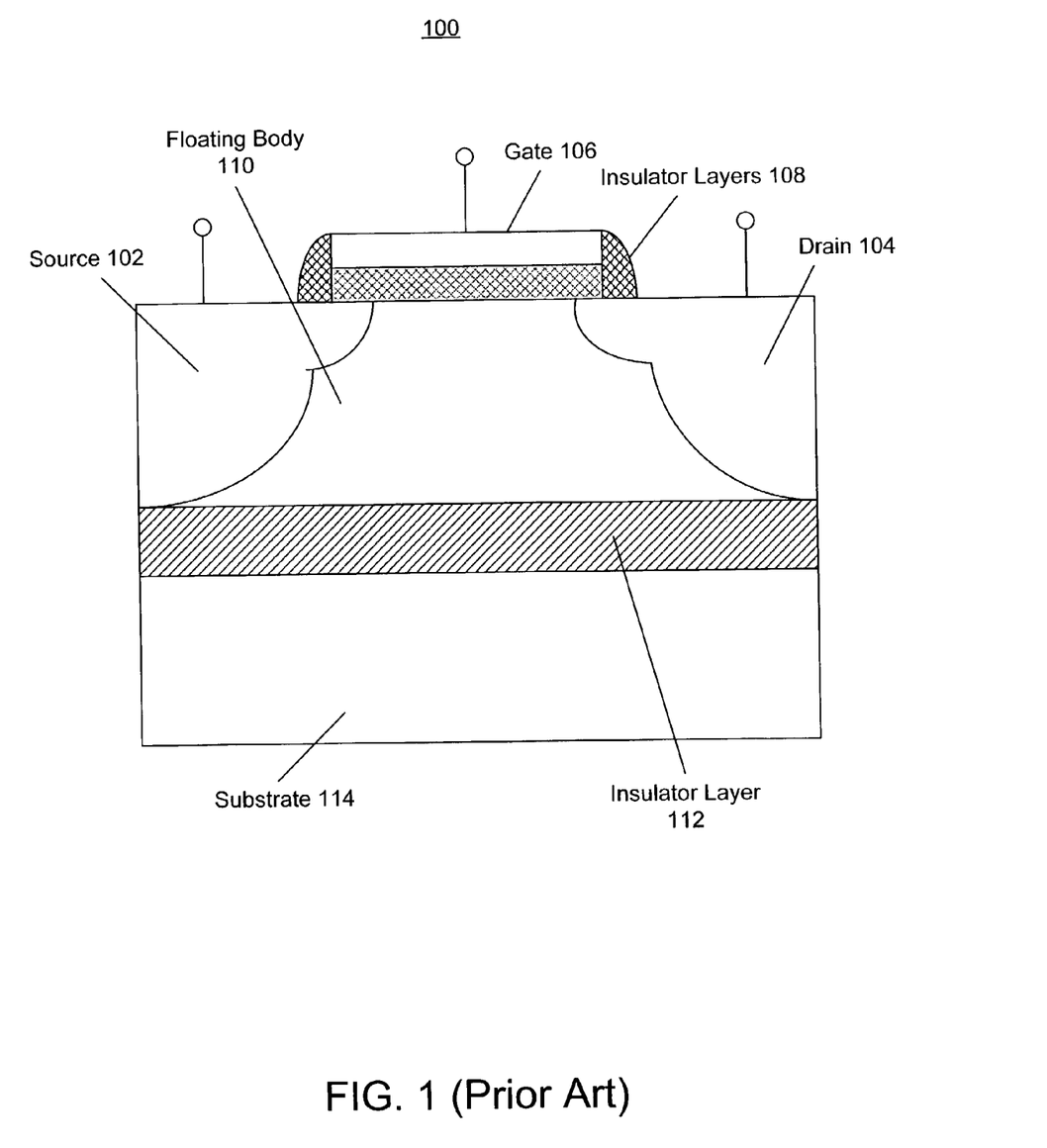
FIG. 1 illustrates a cross-sectional view of a PD/SOI transistor.

The use of partially depleted/silicon-on-insulator (PD/SOI) transistors is known in the industry. FIG. 1 illustrates a cross-sectional view of a PD/SOI transistor. The elements of the transistor 100 are not shown in proportion. The transistor 100 comprises a substrate 114. Formed on the substrate are a source 102, a drain 104, and a floating body region 110 between the source 102 and drain 104. Above the source 102, drain 104, and body region 110 are a gate 106 and insulator layers 108. The insulator layers 108 can be oxide, nitride, a combination of oxide and nitride, or some other insulating material. Another insulator layer 112 resides between the floating body 110 and the rest of the substrate 114, isolating the body 110. When the transistor 100 is charged after being dormant for a significant amount of time, excess charge builds within the floating body 110 due to slow carrier recombination/generation processes. As the excess charge builds, the threshold voltage of the transistor 100 is lowered and varies over time. This variance is known in the industry as the "hysteresis" effect. Eventually, the transistor 100 reaches a steady state.

Figure 2A:
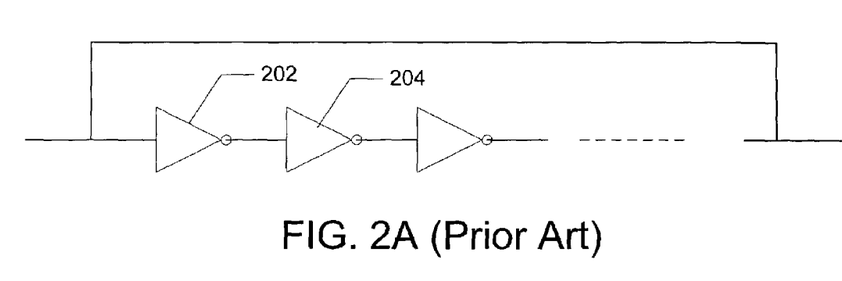
FIG. 2A illustrates a conventional ring oscillator.

Because of the hysteresis effect, the switching speed of the PD/SOI transistor 100 varies depending on its switching history. The speed at which transistors switch is typically measured using a ring oscillator. FIG. 2A illustrates a conventional ring oscillator. The ring oscillator comprises an odd number of inverter circuits 202, 204, . . . utilizing PD/SOI transistors, with the output of the last inverter circuit coupled to the input of the first inverter circuit, forming a ring.

Figure 2B:
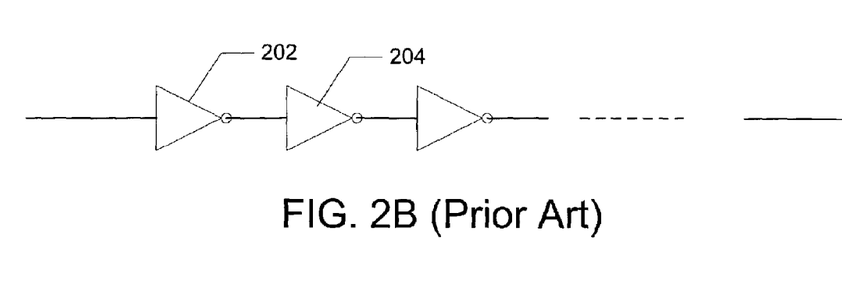
FIG. 2B illustrates a conventional delay chain.

However, with a ring oscillator, the first and second switching speeds are not measurable, as the ring oscillator runs in steady state. To measure the first and second switching speeds, an open delay chain is typically used. FIG. 2B illustrates a conventional delay chain. The delay chain comprises a plurality of inverter circuits 202, 204, . . . utilizing PD/SOI transistors.

Figure 2C:
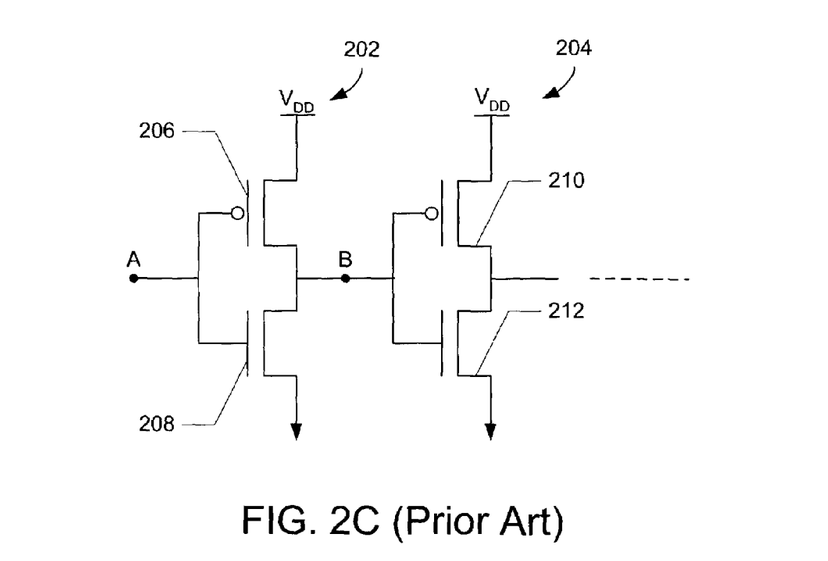
FIG. 2c illustrates two stages of conventional inverter circuits for either the ring oscillator or the delay chain.

FIG. 2C illustrates two stages of conventional inverter circuits in either the ring oscillator or the delay chain. An inverter circuit 202 of the first stage comprises a first PD/SOI n-channel metal oxide semiconductor field effect transistor (MOSFET) 208 and a first PD/SOI p-channel MOSFET 206, coupled as shown. The inverter circuit 202 is powered with a voltage $V_{DD}$. Another inverter circuit 204 of a second stage comprises a second n-channel PD/SOI MOSFET 212 and a second p-channel PD/SOI MOSFET 210.

In FIG. 2C, assume that the voltage of Node A has been held low (0V) for a long time, and then starts transitioning between high ($V_{DD}$) and low (0V) rapidly. In the steady state, with Node A low, transistor 208 is turned off, transistor 206 is turned on, and Node B is high ($V_{DD}$). As Node A transitions to $V_{DD}$, transistor 208 turns on, 206 turns off, and Node B goes to 0V. This first delay between the transitions of Node A and Node B is called first switch.

Later, as Node A returns to 0V, transistors 208 and 206 revert to being off and on, respectively. When Node A goes to $V_{DD}$ again, transistor 208 and 206 switch on and off again, respectively, and Node B goes to 0V. This second delay between the transitions of Node A and B is called second switch. Although the external nodes of the transistors switch through exactly the same voltages, first switch and second switch delays in PD/SOI transistors are different. This is because the first switch has altered the voltage of the floating bodies of transistors 206 and 208, changing their threshold voltages, and causing the delay of the second switch to be different.

Eventually, a steady state is reached. Due to the hysteresis effect, the first switch, second switch, and steady state all have different speeds, and the difference in these speeds is a key metric for SOI technology. The speeds of the first and second switches approximately bracket the range of delay that will occur between the initial waveform propagation and steady state.

However, in order to accurately measure the difference between the first and second switching speeds, the delay chain usually requires thousands of stages. This utilizes a lot of area on a silicon wafer, making the measuring process costly.

Accordingly, there exists a need for a method and apparatus for reducing a number of stages for measuring first and second switching speeds for PD/SOI transistors. The present invention addresses such a need.

SUMMARY OF THE INVENTION

A method and apparatus for reducing the number of stages for measuring first and second switching speeds for PD/SOI transistors uses an inverter circuit which includes: a p-channel body-tied transistor; an n-channel body-tied transistor, coupled at their drains and gates; and a first and a second group of components tied to the bodies of the transistors. The first group restores body potentials for the transistors if the inverter circuit belongs to an even numbered stage of a ring oscillator. The second group provides body potentials for the transistors if the inverter circuit belongs to an odd numbered stage. After each transition of a waveform, the body potentials for the PD/SOI transistors are restored to the original potentials as stored in the capacitors. In this manner, a ring oscillator with a fewer number of stages may be used to accurately measure the first and second switching speeds.

DETAILED DESCRIPTION

The present invention provides a method and apparatus for reducing a number of stages for measuring first and second switching speeds for PD/SOI transistors. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

In the method and apparatus in accordance with the present invention, an inverter circuit comprising PD/SOI body-tied transistors are used in each stage of a ring oscillator. The original body potentials for the transistors are stored in capacitors. After each transition of a waveform down a stage of the ring oscillator, the body potentials for the PD/SOI transistors are restored to the original potentials as stored in the capacitors. In this manner, a much smaller ring oscillator with fewer number of stages may be used to accurately measure the first and second switching speeds.

To more particularly describe the features of the present invention, please refer to FIGS. 3 through 7B in conjunction with the discussion below.

Figure 3:
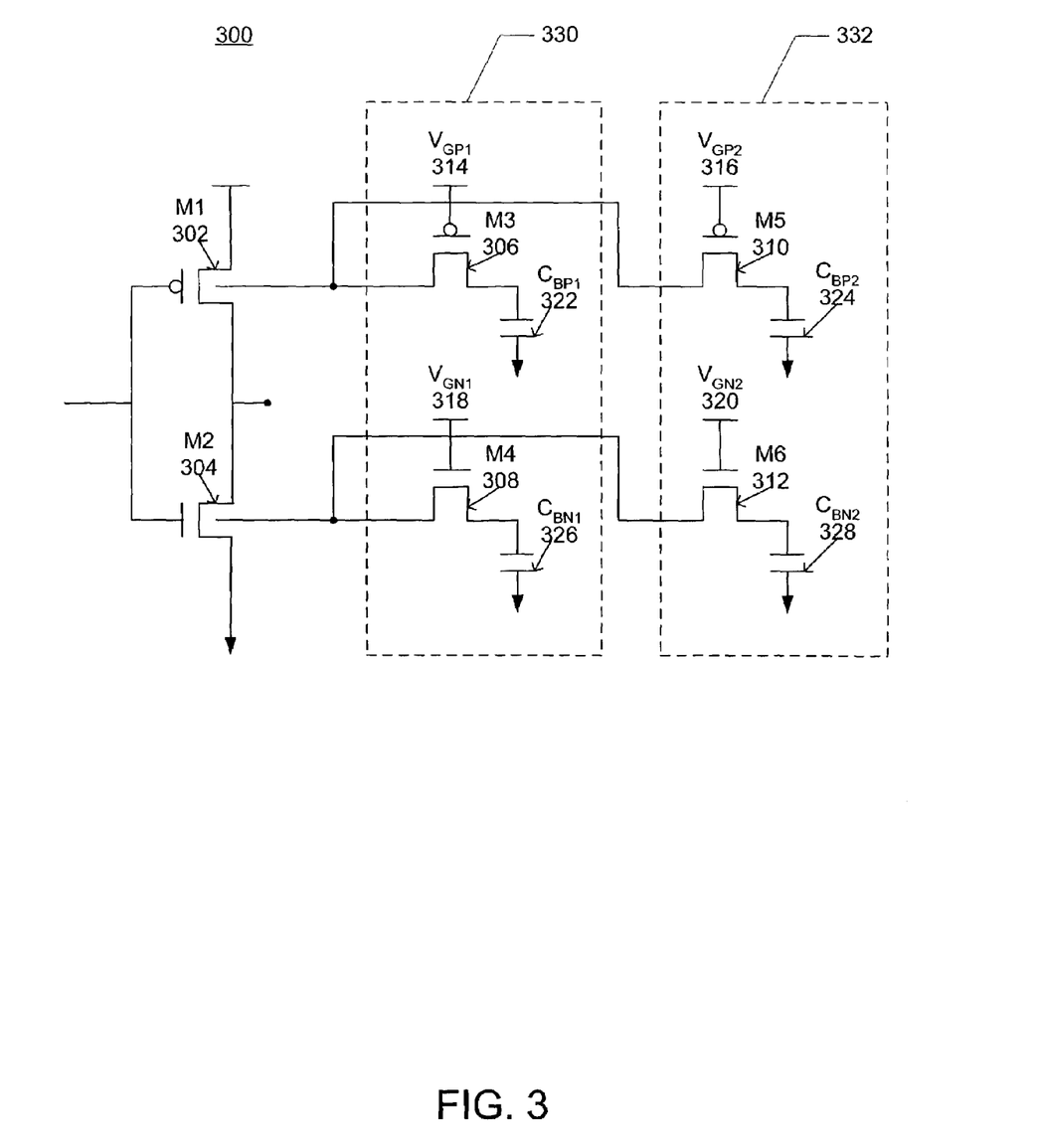
FIG. 3 illustrates a preferred embodiment of an inverter circuit for a ring oscillator in accordance with the present invention.

FIG. 3 illustrates a preferred embodiment of an inverter circuit for a ring oscillator in accordance with the present invention. The inverter circuit 300 comprises a p-channel PD/SOI body-tied MOSFET 302 (M1) and an n-channel PD/SOI body-tied MOSFET 304 (M2). The bodies of M1 302 and M2 304 are tied either to a first group of components 330 or a second group of components 332. Either the first or second group of components 330 stores the original body potentials for M1 302 and M2 304, depending on the stage of the inverter circuit 300 in the ring oscillator. In the preferred embodiment, the first group of components 330 comprises a first access transistor 306 (M3), a first capacitor 322 ($C_{BP1}$), a second access transistor 308 (M4), and a second capacitor 326 ($C_{BN1}$). The second group of components 332 comprises a third access transistor 310 (M5), a third capacitor 324 ($C_{BP2}$), a fourth access transistor 312 (M6), and a fourth capacitor 328 ($C_{BN2}$).

Either $V_{GP1}$ and $V_{GN1}$, or $V_{GP2}$ and $V_{GN2}$, of each inverter circuit of the ring oscillator are turned on to charge $C_{BP1}$ 322 and $C_{BN1}$ 326, or $C_{BP2}$ 324 and $C_{BN2}$ 328, respectively, to the original body potentials of M1 302 and M2 304, depending on the stage of the inverter circuit. When $V_{GP1}$ and $V_{GN1}$ are applied to M3 306 and M4 308, respectively, $C_{BP1}$ 322 and $C_{BN1}$ 326 are charged to the body potentials of M1 302 and M2 304. When $V_{GP2}$ and $V_{GN2}$ are applied to M5 310 and M6 312, respectively, $C_{BP2}$ 324 and $C_{BN2}$ 328 are charged to the body potentials of M1 302 and M2 304.

The ring oscillator is first held in a steady state by a gating stage, such as a NAND gate. On every other stage, $V_{GP1}$ and $V_{GN1}$ are biased appropriately so that M3 306 and M4 308 are "on", and $C_{BP1}$ 322 and $C_{BN1}$ 326 are charged to the original body potentials of M1 302 and M2 304. On alternating stages, $V_{GP2}$ and $V_{GN2}$ are biased appropriately so that $C_{BP2}$ 324 and $C_{BN2}$ 328 are charged to the body potentials of M1 302 and M2 304 in that stage.

After the ring oscillator is turned on, M3 306, M4 308, M5 310, and M6 312 are turned off, so that M1 302 and M2 304 can switch as floating body devices. A waveform is then input into the ring oscillator, passing through each stage and looping back around.

Assume that the inverter circuit 300 is an even numbered stage in the ring oscillator, so that $C_{BP1}$ 332 and $C_{BN1}$ 326 store the original body potentials for M1 302 and M2 304, respectively. Assume that in the first transition of a waveform, M1 302 was pulled up and M2 304 was pulled down. If there is a second transition of the waveform, M1 302 is pulled down and M2 304 is pulled up. Before the waveform loops back, $V_{GP1}$ and $V_{GN1}$ are turned on, causing the body of M1 302 to be charged back to the potential stored in $C_{BP1}$ 322 and the body of M2 304 to be charged back to the potential stored in $C_{BN1}$ 326. Since $C_{BP1}$ 322 and $C_{BN1}$ 326 stored the original body potentials of M1 302 and M2 304, when the waveform loops back, M1 302 and M2 304 will again go through the first and second switches.

Similarly, assume that the inverter circuit 300 is an odd numbered stage in the ring oscillator, so that $C_{BP1}$ 324 and $C_{BN2}$ 328 store the original body potentials for M1 302 and M2 304, respectively. Assume that in the first transition of the waveform, M1 302 was pulled down and M2 304 was pulled up. If there is a second transition of the waveform, M1 302 is pulled up and M2 304 is pulled down. Before the waveform loops back, $V_{GP2}$ and $V_{GN2}$ are turned on, causing the body of M1 302 to be charged to the potential stored in $C_{BP2}$ 324 and the body of M2 304 to be charged to the potential stored in $C_{BN2}$ 328. Since $C_{BP2}$ 324 and $C_{BN2}$ 328 stored the original body potentials of M1 302 and M2 304, when the waveform loops back, M1 302 and M2 304 will again go through the first and second switches.

By continuing to restore the body potentials of M1 302 and M2 304 to the original body potentials in this manner, fewer stages of inverter circuits are required in the ring oscillator to accurately measure the first and second switching speeds. This in turn reduces the amount of area on the silicon wafer required to perform the measurement.

In the preferred embodiment, M3 306, M4 308, M5 310, and M6 312 are controlled with self-timing circuits based on the state of earlier stages in the ring oscillator. The number of stages in the ring oscillator needs to be high enough so that the switch and recharge of the bodies of M1 302 and M2 304 can be accomplished before the waveform does a complete round-trip. Also, the value of $C_{BP1}$ 322, $C_{BN1}$ 326, $C_{BP2}$ 324, and $C_{BN2}$ 328 should be large compared to the capacitance of the bodies of M1 302 and M2 304 so that the bodies will assume essentially the potentials of $C_{BN1}/C_{BN2}$ and $C_{BP1}/C_{BP2}$, respectively.

Figure 4:
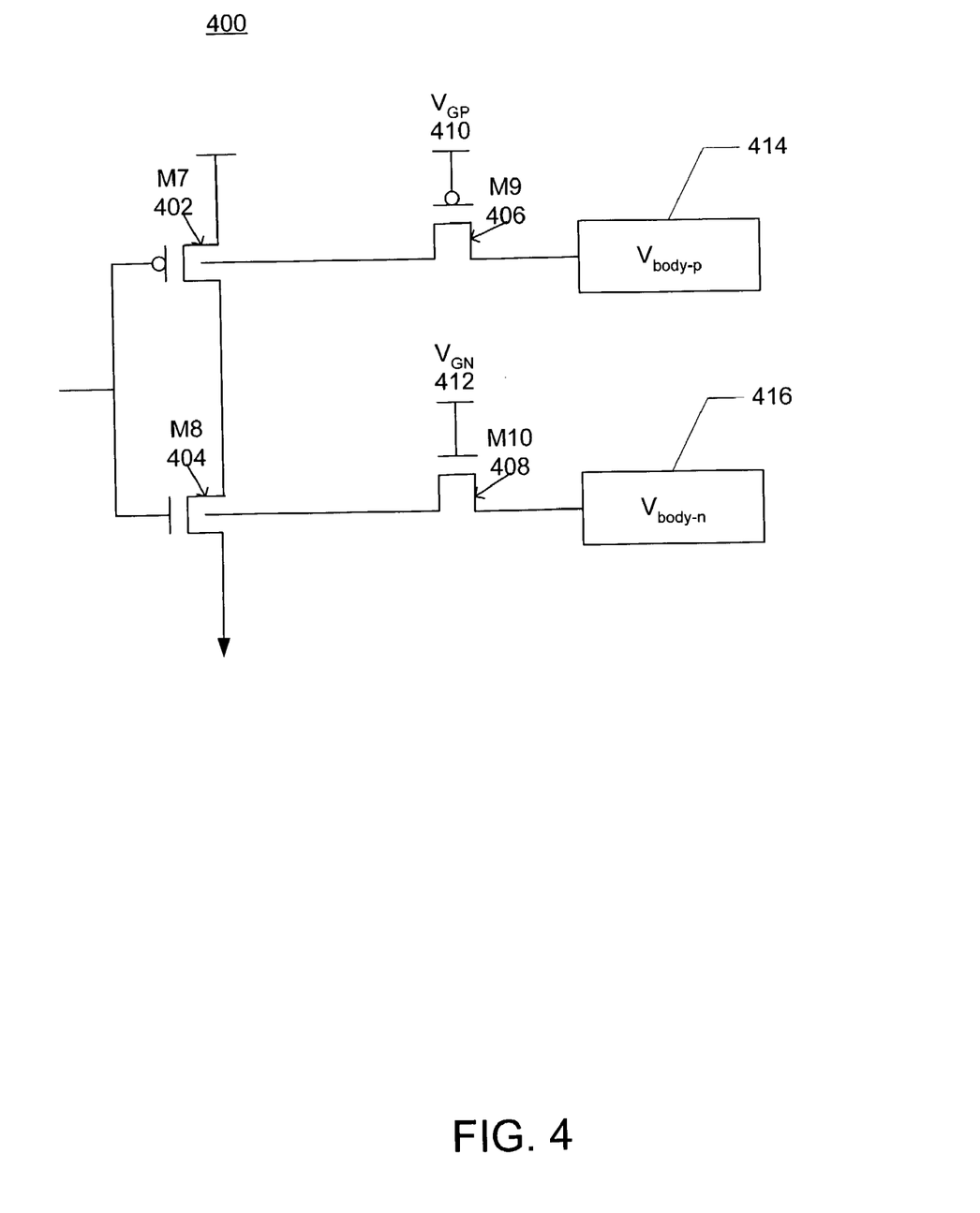
FIG. 4 illustrates another preferred embodiment of an inverter circuit in accordance with the present invention.

Instead of restoring the body potentials of M1 302 and M2 304 to their respectively initial potentials, the bodies can also be forced to have other potentials. FIG. 4 illustrates another preferred embodiment of an inverter circuit in accordance with the present invention. The inverter circuit 400 comprises an n-channel PD/SOI body-tied MOSFET 402 (M7) and a p-channel PD/SOI body-tied MOSFET 404 (M8). The bodies of M7 402 and M8 404 are tied to a first access transistor 406 (M9) and a second access transistor 408 (M10), respectively. However, instead of restoring the body potentials using capacitors, the bodies of M7 402 and M8 404 are forced to have a particular potential, supplied by voltage sources 414 and 416, respectively. This allows an improved understanding of how body conditions change the delay over a range of body potentials.

Figure 5:
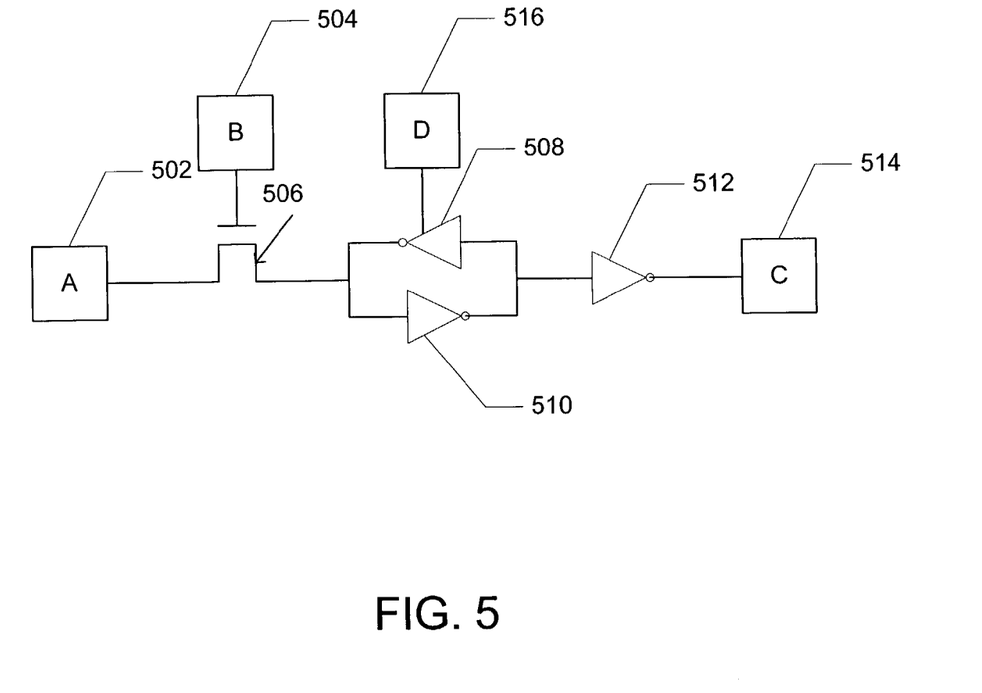
FIG. 5 illustrates a circuit for measuring the allowable voltage swing for a PD/SOI transistor before charge dump failure occurs.

A problem relating to PD/SOI transistors when used as pass gates, multiplexers and SRAMs, and access gates is their subjectivity to charge dump failure. FIG. 5 illustrates a circuit for measuring the allowable voltage swing for a PD/SOI transistor before charge dump failure occurs. The PD/SOI transistor 506 is coupled to inverters 508, 510, and 512 as shown. Initial voltages are applied at nodes A 502 and B 504. These voltages are then lowered in increments. The voltage at node C 514 is observed to see when the node goes low. Node C 514 will go low when the PD/SOI transistor 506 experiences charge dump failure. In this manner, the allowable voltage swing is measured. Other parameters, such as the voltage at node D 516 and the temperature can also be changed to obtain the voltage swing.

Figure 6:
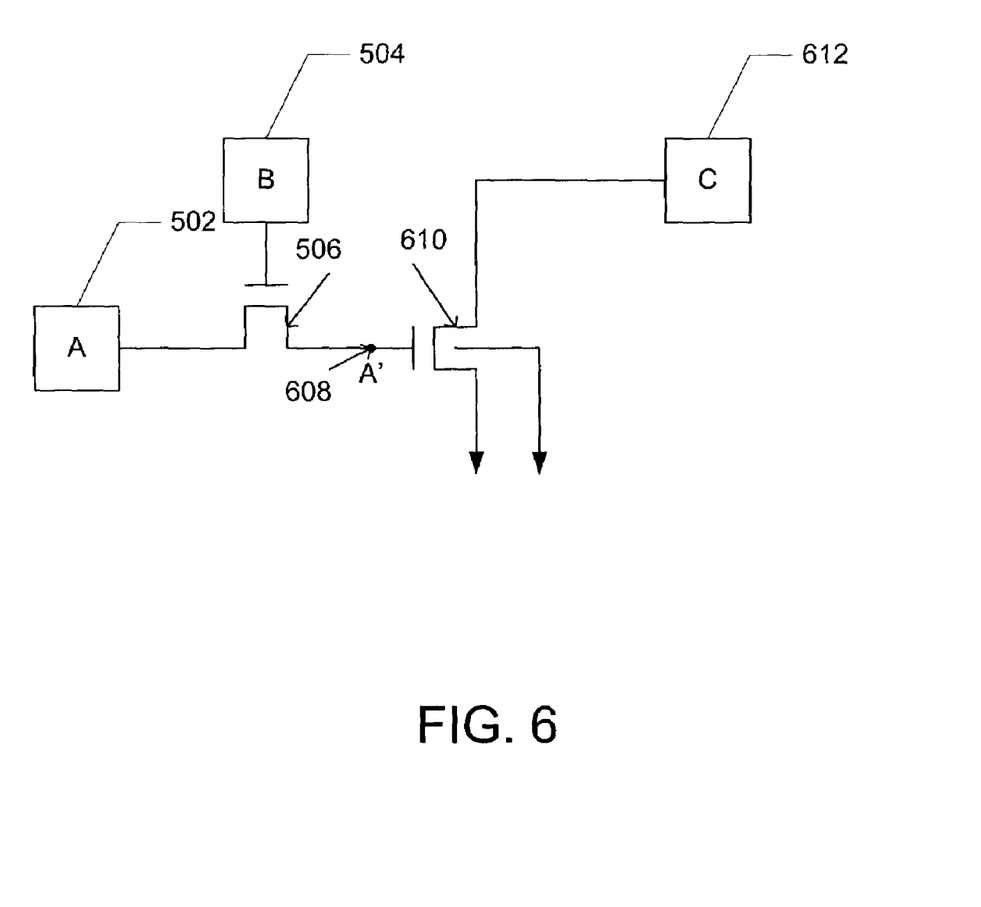
FIG. 6 illustrates a circuit for measuring the amount of charge loss by a PD/SOI transistor when charge dump failure occurs.

FIG. 6 illustrates a circuit for measuring the amount of charge loss by a PD/SOI transistor when charge dump failure occurs. The second PD/SOI transistor 610 coupled to the PD/SOI transistor 506 as shown. The $I_{OUT}$ $V_S$ $V_{IN}$ function of the second transistor 610 is calibrated by holding node B 504 at a voltage that will allow node A' 608 to track node A 502.

Then, the voltage at node A 502 ($V_A$) is swept from 0V to a maximum voltage. Next, a voltage, $V_X$, is stored on node A' 608 by placing $V_X$ on node A 502 with the voltage at node B 504 (VB) high. The current at node C 612 ($I_{C1}$) is then measured. $V_B$ is then set equal to $V_A$, and the current at node C 612 ($I_{C2}$) is measured again. Then, $V_B$ is set between $V_A$ and ground, and the current at node C 612 ($I_{C3}$) is measured again. More measurements can be made.

Because the output current $I_C$ was calibrated as described above with known voltages, the stored voltages on node A' 608 can be calculated for the measured output currents, $I_{C1}$, $I_{C2}$, and $I_{C3}$. With this method, the amount of voltage lost at node A' 608 when the transistor 506 experiences charge dump failure can be calculated.

Figure 7A:
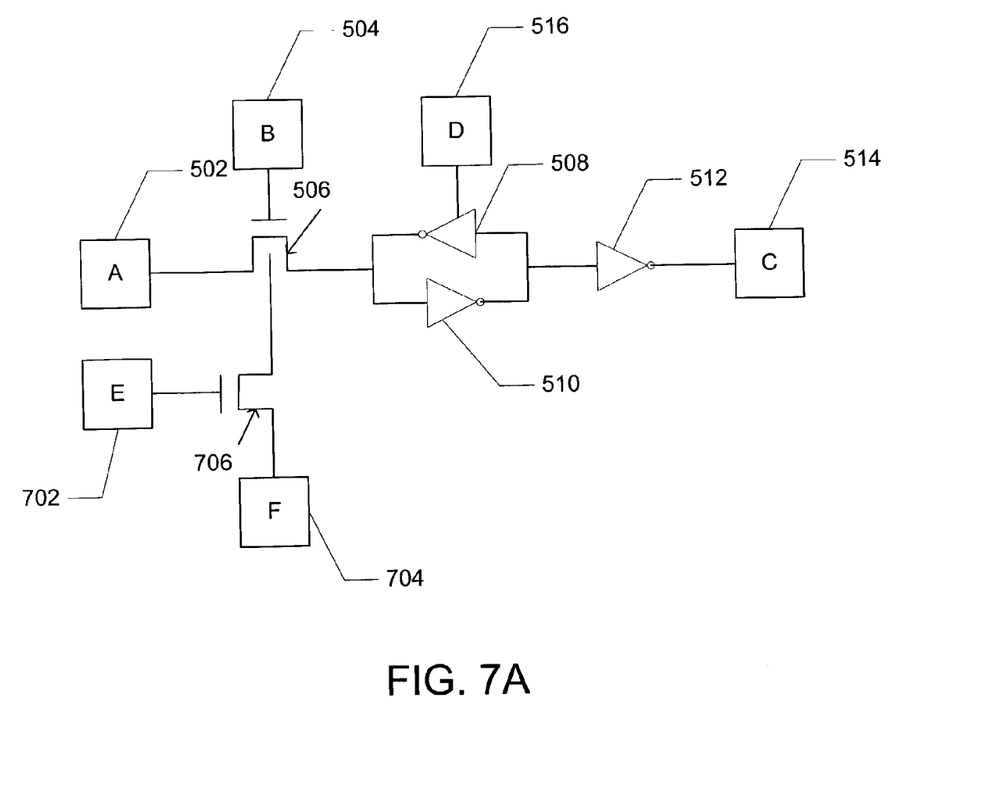
FIGS. 7A and 7B illustrate alternative circuits for measuring other situations for PD/SOI transistors.
Figure 7B:
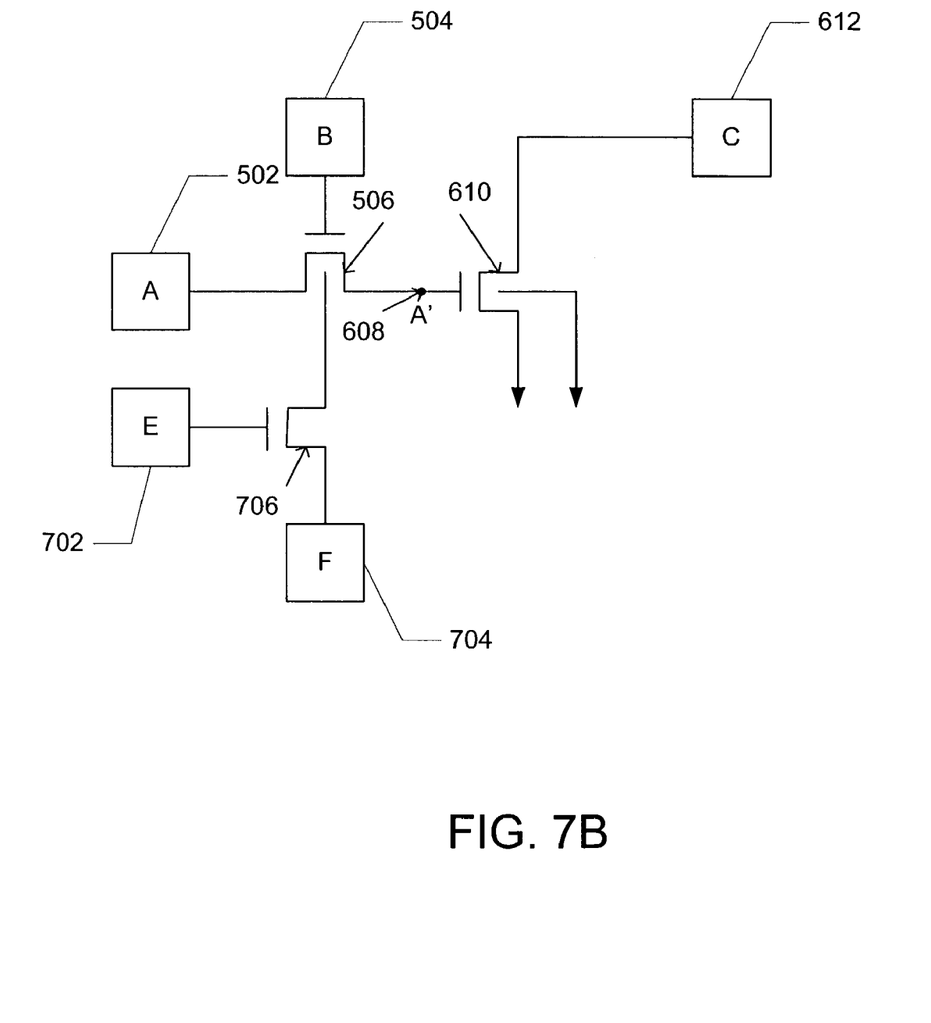

To measure situations other than charge dump failure for PD/SOI transistors, the body of the PD/SOI transistors 506 can be preset to a particular potential by coupling the body to another PD/SOI transistor 706, as illustrated in FIGS. 7A and 7B, and applying specific voltages at nodes E 702 and F 704. The behavior at node C 514 or 612 can then be observed.

Another problem relating to PD/SOI transistors is the self-heating body. Because the body is floating, heat generated in the body is not dissipated well. This heating slows down the performance of the PD/SOI transistor. To monitor the self-heating of the transistor and to improved its performance, a resister-type test structure, such as a gate polysilicon structure, can be formed on a wafer. The resistance across the test structure changes as the temperature of the test structure changes. This change is resistance can be monitored. Several of the test structures can be created and monitored to form a resistance/temperature map. In addition, such test structures can be created at various locations on a wafer and be used to monitor the rise in temperature. In this manner, the self-heating of the body in PD/SOI transistors can be better understood.

A method and apparatus for reducing a number of stages for measuring first and second switching speeds for PD/SOI transistors has been disclosed. An inverter circuit comprising PD/SOI body-tied transistors are used in each stage of a ring oscillator. The original body potentials for the transistors are stored in capacitors. After each transition of a waveform down a stage of the ring oscillator, the body potentials for the PD/SOI transistors are restored to the original potentials as stored in the capacitors. In this manner, a ring oscillator with a fewer number of stages may be used to accurately measure the first and second switching speeds.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An inverter circuit, comprising:
a first transistor, comprising a p-channel body-tied transistor;
a second transistor, comprising an n-channel body-tied transistor, wherein a drain of the second transistor is coupled to a drain of the first transistor, wherein a gate of the first transistor is coupled to a gate of the second transistor;
a first group of components coupled to a body of the first transistor and to a body of the second transistor, wherein the first group of components provides body potentials for the first and second transistors if the inverter circuit belongs to an even numbered stage of a chain of inverter circuits; and
a second group of components coupled to the body of the first transistor and to the body of the second transistor, wherein the second group of components provides body potentials for the first and second transistors if the inverter circuit belongs to an odd numbered stage of the chain of inverter circuits;
wherein the first group of components comprises:
a third transistor, comprising a p-channel floating body transistor, wherein a drain of the third transistor is coupled to the body of the first transistor;
a first capacitor coupled to a source of the third transistor;
a first voltage source coupled to a gate of the third transistor;
a fourth transistor, comprising an n-channel floating body transistor, wherein a source of the fourth transistor is coupled to the body of the second transistor;
a second capacitor coupled to a drain of the fourth transistor; and
a second voltage source coupled to a gate of the fourth transistor.

2. The circuit of claim 1, wherein the first and second capacitors restores original body potentials for the first and second transistors.

3. An inverter circuit, comprising:
a first transistor, comprising a p-channel body-tied transistor;
a second transistor, comprising an n-channel body-tied transistor, wherein a drain of the second transistor is coupled to a drain of the first transistor, wherein a gate of the first transistor is coupled to a gate of the second transistor;
a first group of components coupled to a body of the first transistor and to a body of the second transistor, wherein the first group of components provides body potentials for the first and second transistors if the inverter circuit belongs to an even numbered stage of a chain of inverter circuits; and
a second group of components coupled to the body of the first transistor and to the body of the second transistor, wherein the second group of components provides body potentials for the first and second transistors if the inverter circuit belongs to an odd numbered stage of the chain of inverter circuits;
wherein the second group of components comprises:

a fifth transistor, comprising a p-channel floating body transistor, wherein a drain of the fifth transistor is coupled to the body of the first transistor;
a third capacitor coupled to a source of the fifth transistor;
a third voltage source coupled to a gate of the fifth transistor;
a sixth transistor, comprising an n-channel floating body transistor, wherein a source of the sixth transistor is coupled to the body of the second transistor;
a fourth capacitor coupled to a drain of the sixth transistor; and
a fourth voltage source coupled to a gate of the sixth transistor.

4. The circuit of claim 3, wherein the third and fourth capacitors restores original body potentials for the first and second transistors.

5. An inverter circuit, comprising:
a first transistor, comprising a p-channel body-tied transistor;
a second transistor, comprising an n-channel body-tied transistor, wherein a drain of the second transistor is coupled to a drain of the first transistor, wherein a gate of the first transistor is coupled to a gate of the second transistor;
a first group of components, comprising:
　a third transistor, comprising a p-channel floating body transistor, wherein a drain of the third transistor is coupled to the body of the first transistor;
　a first capacitor coupled to a source of the third transistor;
　a first voltage source coupled to a gate of the third transistor;
　a fourth transistor, comprising an n-channel floating body transistor, wherein a source of the fourth transistor is coupled to the body of the second transistor;
　a second capacitor coupled to a drain of the fourth transistor; and
　a second voltage source coupled to a gate of the fourth transistor, wherein the first and second capacitors provide body potentials for the first and second transistors if the inverter circuit belongs to an even numbered stage of a chain of inverter circuits; and
a second group of components, comprising:
　a fifth transistor, comprising a p-channel floating body transistor, wherein a drain of the fifth transistor is coupled to the body of the first transistor;
　a third capacitor coupled to a source of the fifth transistor;
　a third voltage source coupled to a gate of the fifth transistor;
　a sixth transistor, comprising an n-channel floating body transistor, wherein a source of the sixth transistor is coupled to the body of the second transistor;
　a fourth capacitor coupled to a drain of the sixth transistor; and
　a fourth voltage source coupled to a gate of the sixth transistor, wherein the third and fourth capacitors provide body potentials for the first and second transistors if the inverter circuit belongs to an odd numbered stage of the chain of inverter circuits.

6. A ring oscillator, comprising:
a first inverter circuit, comprising:
　a first transistor, comprising a p-channel body-tied transistor;
　a second transistor, comprising an n-channel body-tied transistor, wherein a drain of the second transistor is coupled to a drain of the first transistor, wherein a gate of the first transistor is coupled to a gate of the second transistor;
　a first group of components coupled to a body of the first transistor and to a body of the second transistor, wherein the first group of components provides body potentials for the first and second transistors; and
　a second group of components coupled to the body of the first transistor and to the body of the second transistor; and
a second inverter circuit, wherein an input of the second inverter circuit is coupled to an output of the first inverter circuit, wherein the second inverter circuit comprises:
　a third transistor, comprising a p-channel body-tied transistor;
　a fourth transistor, comprising an n-channel body-tied transistor, wherein a drain of the fourth transistor is coupled to a drain of the third transistor, wherein a gate of the third transistor is coupled to a gate of the fourth transistor;
　a third group of components coupled to a body of the third transistor and to a body of the fourth transistor; and
　a fourth group of components coupled to the body of the third transistor and to the body of the fourth transistor, wherein the third group of components provides body potentials for the third and fourth transistors.

7. An inverter circuit, comprising:
a first transistor, comprising a p-channel body-tied transistor;
a second transistor, comprising an n-channel body-tied transistor, wherein a drain of the second transistor is coupled to a drain of the first transistor, wherein a gate of the first transistor is coupled to a gate of the second transistor;
a third transistor, comprising a p-channel floating body transistor, wherein a drain of the third transistor is coupled to a body of the first transistor, wherein a first voltage source is coupled to a source of the third transistor, and wherein a second voltage source is coupled to a gate of the third transistor; and
a fourth transistor, comprising an n-channel floating body transistor, wherein a drain of the fourth transistor is coupled to a body of the second transistor, wherein a third voltage source is coupled to a source of the fourth transistor, and wherein a fourth voltage source is coupled to a gate of the fourth transistor.

* * * * *